(12) United States Patent
Chou

(10) Patent No.: US 6,407,919 B1
(45) Date of Patent: Jun. 18, 2002

(54) STRUCTURE OF COMPUTER CPU HEAT DISSIPATION MODULE

(76) Inventor: Fargo Chou, Fl. 2, No. 4, Lane 188, Sec. 1, Hoping East Rd., Taipei (TW)

( * ) Notice: Subject to any disclaimer, the term of this patent is extended or adjusted under 35 U.S.C. 154(b) by 0 days.

(21) Appl. No.: 09/737,747

(22) Filed: Dec. 18, 2000

(51) Int. Cl.7 .............................................. H01L 23/467
(52) U.S. Cl. ....................... 361/697; 361/687; 361/692; 361/695; 361/704; 257/721; 174/16.3; 454/184
(58) Field of Search ................................ 361/687–689, 361/690–695, 702–710, 717–722, 697–699, 727, 683; 257/706–727; 174/15.1, 15.2, 16.3, 252, 254, 260; 165/80.2, 80.3, 80.4, 125, 121, 122, 185; 415/178, 211.1, 55.5, 61, 66, 211.2, 177, 213.1, 186, 208.4; 454/184; 411/352, 353, 152, 153, 544; 24/500, 502, 544, 615, 625; 248/316.7, 505, 510; 267/150, 160

(56) References Cited

U.S. PATENT DOCUMENTS

| | | | | |
|---|---|---|---|---|
| 4,715,438 A | * | 12/1987 | Gabusda et al. | ............ 165/185 |
| 5,475,564 A | * | 12/1995 | Chiou | ......................... 361/704 |
| 5,597,034 A | * | 1/1997 | Barker et al. | .............. 165/80.3 |
| 5,664,622 A | * | 9/1997 | Chiou | ........................ 165/80.2 |
| 5,678,627 A | * | 10/1997 | Lee | ............................ 165/80.3 |
| 5,740,014 A | * | 4/1998 | Lin | ............................. 361/697 |
| 5,943,209 A | * | 8/1999 | Liu | ............................. 361/695 |
| 5,960,862 A | * | 10/1999 | Hu | ............................. 165/80.3 |
| 6,160,704 A | * | 12/2000 | Rusate | ........................ 361/697 |
| 6,336,499 B1 | * | 1/2002 | Lin | ............................. 165/80.3 |
| 6,343,014 B1 | * | 1/2002 | Lin | ............................. 361/697 |

FOREIGN PATENT DOCUMENTS

| JP | 407297331 A | * | 11/1995 | ........... H01L/23/40 |
|---|---|---|---|---|
| JP | 410223816 A | * | 8/1998 | ......... H01L/23/467 |
| JP | 02000340726 A | * | 12/2000 | ......... H01L/23/467 |

* cited by examiner

Primary Examiner—Darren Schuberg
Assistant Examiner—Michael Datskovsky
(74) Attorney, Agent, or Firm—Rosenberg, Klein & Lee

(57) ABSTRACT

A structure of computer CPU heat dissipation module comprising a heat dissipation fin, a heat dissipation fan, a pair of fastening element, the CPU being mounted at a CPU seat and the top of the CPU mounted with the heat dissipation fin, and the top face of the heat fin being mounted with the heat dissipation fan which is then fastened by the fastening element, characterized in that the heat dissipation fin is a cubic structure having a height approximate the same as the length and width and the heat dissipation side fin is protruded toward the surrounding and the bottom end thereof is tapered, and the heat dissipation fan has a fan body enclosed a unidirectional mask housing which can exactly cover the wall of the top surrounding of the heat dissipation fin such that the fan body is stacked on the top of the heat dissipation fin, and the fastening element has one end being a fastening body, and the other end is a fastening ring, the back end of the fastening body has a suspension clip so as to fasten the top end at the two lateral wall of the mask housing, thereby the fastening body can cause the fastening ring to fasten the fastening hook corresponding to the CPU seat.

3 Claims, 5 Drawing Sheets

STRUCTURE OF COMPUTER CPU HEAT DISSIPATION MODULE

BACKGROUND OF THE INVENTION (a) Field of the Invention

The present invention relates to a structure of computer CPU heat dissipation module, and in particular, a heat dissipation fan with a mask housing mounted at the external of the fan. The heat dissipation fin is a cube with a large volume of heat dissipation capacity.

(b) Description of the Prior Art

The upgrading of computer CPU efficiency is important in all computers. If the operation ability of the CPU is faster, the operation ability of the computer with this CPU will be faster. Thus, it is a trend that the speed of CPU is to be upgraded in the manufacturing of computers. However, the heat energy generated by a high speed CPU of a computer will relatively higher, and therefore, a powerful heat dissipation module has to be mounted to the CPU of the computer so as to reduce the working temperature of the CPU in order to maintain normal operation.

FIG. 1 shows a conventional computer CPU heat dissipation module. This module has thin heat dissipation fin 10, or on the heat dissipation fin 10, a heat dissipation fan 20 with a small thickness is mounted. The surrounding of the heat dissipation fan 20 does not have a mask body 21. Even the heat dissipation fan is equipped with such a mask body 21, the mask body 21 and the fan body 22 are normally mounted on a securing housing body, and the height thereof is similar to that of the fan body 22. The heat dissipation body 10 is a flat board having a top end extended to a plurality of the heat dissipation side fins 11, 12 being the heat conductor. The flat, back surface at the other end of the heat dissipation side fins 11, 12 is adhered to the CPU top surface by a sealing adhesive, and a fastening hook 23 at the surrounding of the heat dissipation fan 20 is engaged with the heat dissipation side fins 11, 12 to form an entire structure.

The above structure can solve the heat dissipation of the CPU of the currently available computer. As shown in FIG. 2, the thickness of the heat dissipation fin 10 being mounted with the heat dissipation fan 20 is not thick, and the volume of heat dissipation of the heat dissipation fin 10 restricts the CPU heat dissipation area to the hot air discharge end of the heat dissipation fan 20. There is only a short heat transfer distance and due to the short distance of the mask body 21, convection current turbulence is formed at the surrounding of the heat dissipation fan 20, which formed into improper air resistance so that the heat discharging efficiency of heat energy is low. If the discharged heat energy is large, the function of heat dissipation is poor. It is understood that this drawback still exists in small for the heat dissipation fin 10 with low volume of heat dissipation, and if the distance of heat dissipation is short, the ventilation at the mask housing 21 is insufficient.

Accordingly, it is the objection of the present invention to provide a structure of computer CPU heat dissipation module to mitigate the above drawbacks.

SUMMARY OF THE INVENTION

Accordingly, it is an object of the present invention to provide a structure of computer CPU heat dissipation module comprising a heat dissipation fin, a heat dissipation fan, a pair of fastening elements, the CPU being mounted at a CPU seat and the top of the CPU mounted with the heat dissipation fin, and the top face of the heat fin being mounted with the heat dissipation fan which is then fastened by the fastening element, characterized in that the heat dissipation fin is a cubic structure having a height approximate the same as the length and width and the heat dissipation side fin is protruded toward the surrounding, and the bottom end thereof is tapered, and the heat dissipation fan has a fan body enclosed a unidirectional mask housing which can exactly cover the wall of the top surrounding of the heat dissipation fin such that the fan body is stacked onto the top of the heat dissipation fin, and the fastening element has one end being a fastening body, and the other end is a fastening ring, the back end of the fastening body has a suspension clip so as to fasten the top end at the two lateral wall of the mask housing, thereby the fastening body can cause the fastening ring to fasten the fastening hook corresponding to the CPU seat.

Yet another object of the present invention to provide a structure of computer CPU heat dissipation module, wherein there is a sufficient distance from the bottom edge of the mask housing to the bottom end of the heat dissipation fin and the convection current turbulence is avoided.

A further object of the present invention to provide a structure of computer CPU heat dissipation module, wherein the heat dissipation module can be used for high speed CPU.

Another object of the present invention to provide a structure of computer CPU heat dissipation module, wherein the mask housing can be removed from the fan body to allow easy maintenance and replacement of parts.

Other object and advantages of the present invention will become more apparent from the following description taken in conjunction with the accompanying drawing.

DETAILED DESCRIPTION OF THE PRESENT INVENTION

Figure 1:
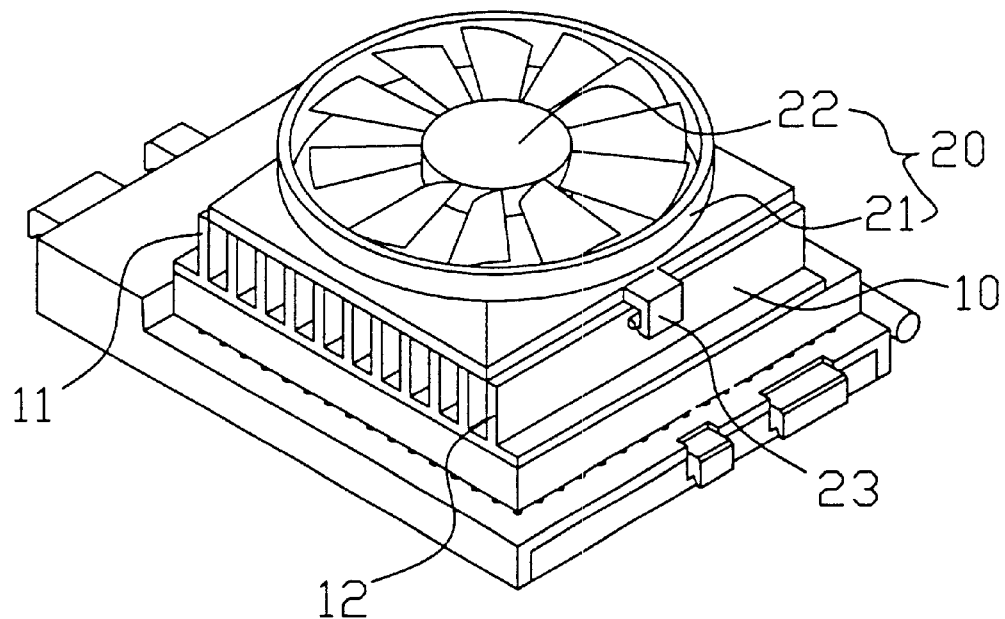
FIG. 1 is a perspective view of a conventional computer CPU heat dissipation module.
Figure 2:
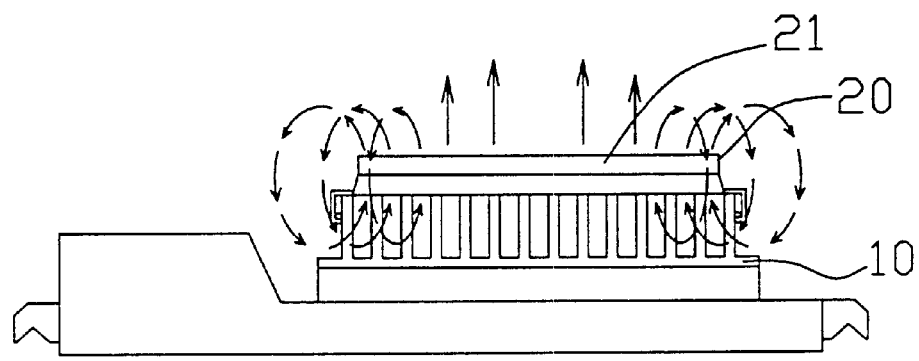
FIG. 2 is a schematic view showing the action of a computer CPU heat dissipation module.
Figure 3:
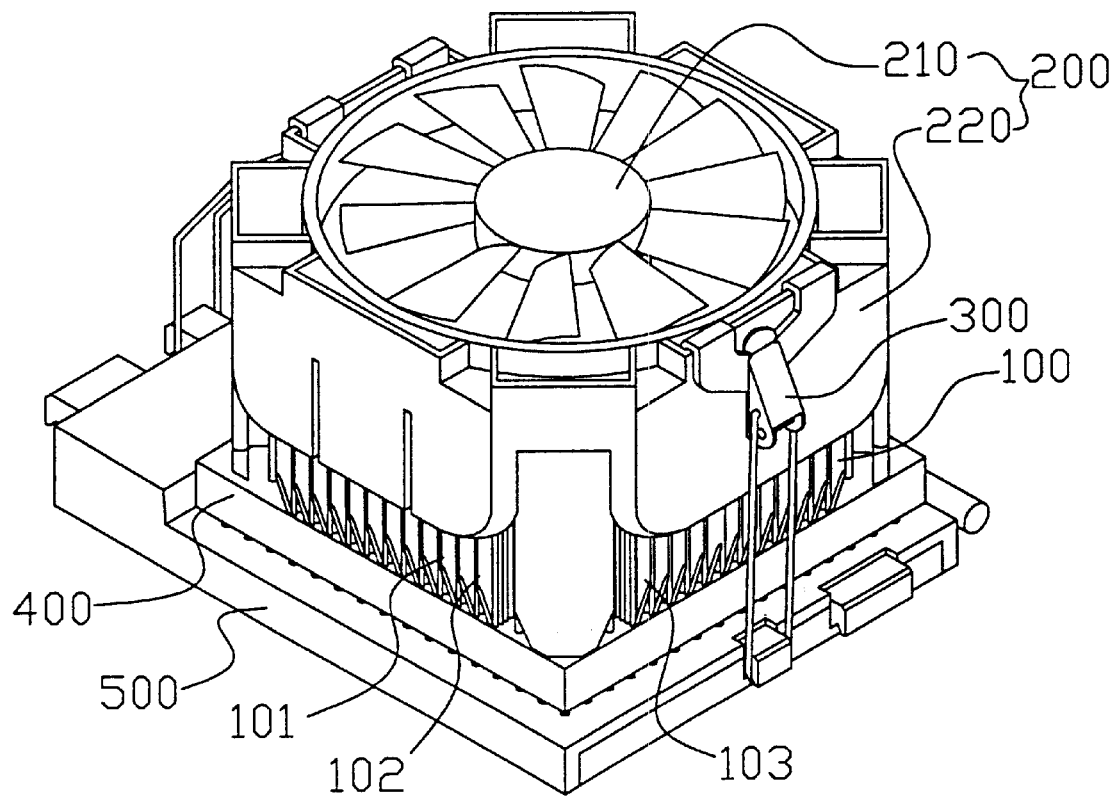
FIG. 3 is a perspective view of a computer CPU heat dissipation module of the present invention.
Figure 4:
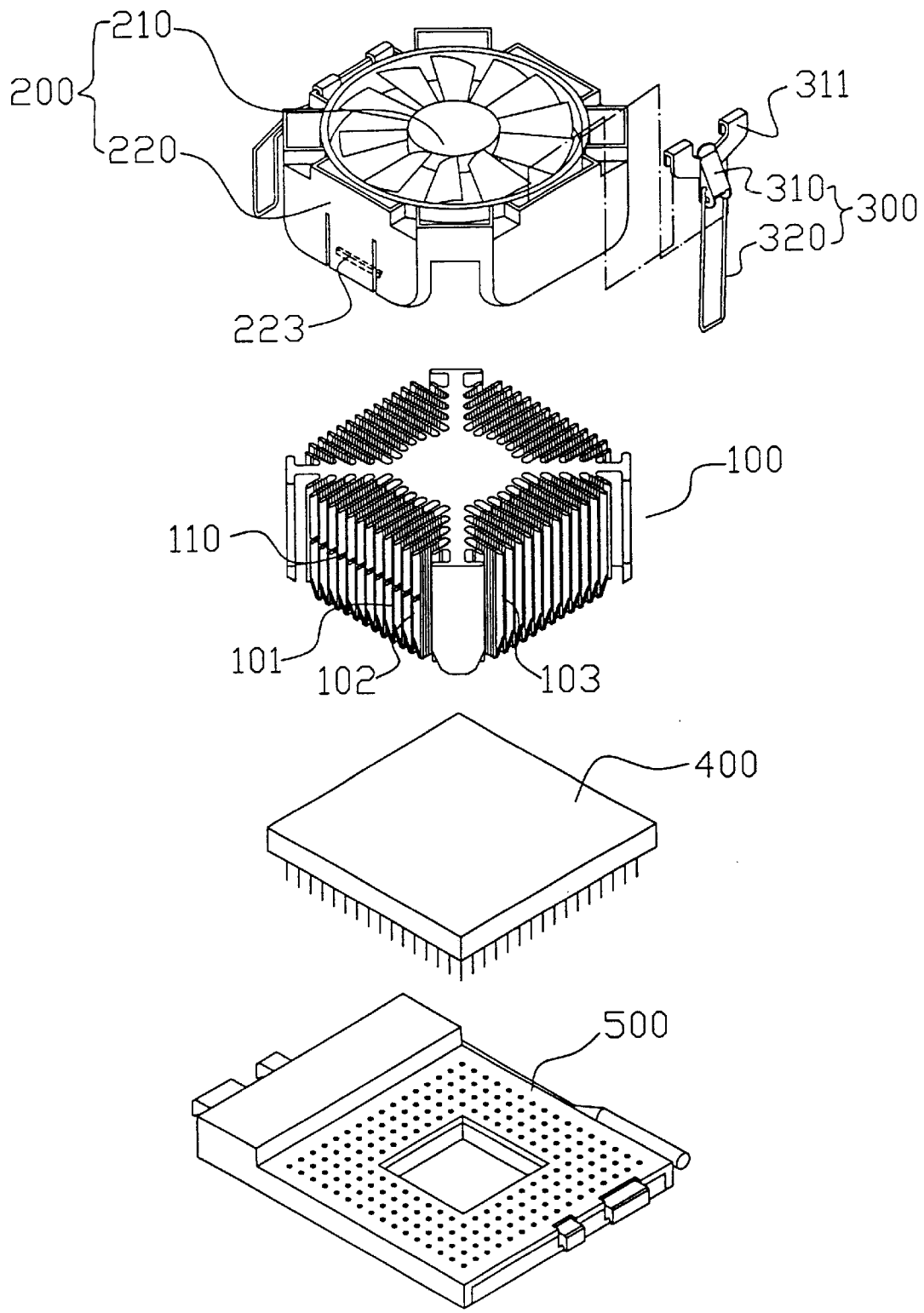
FIG. 4 is a perspective exploded view of a computer CPU heat dissipation module of the present invention.
Figure 5:
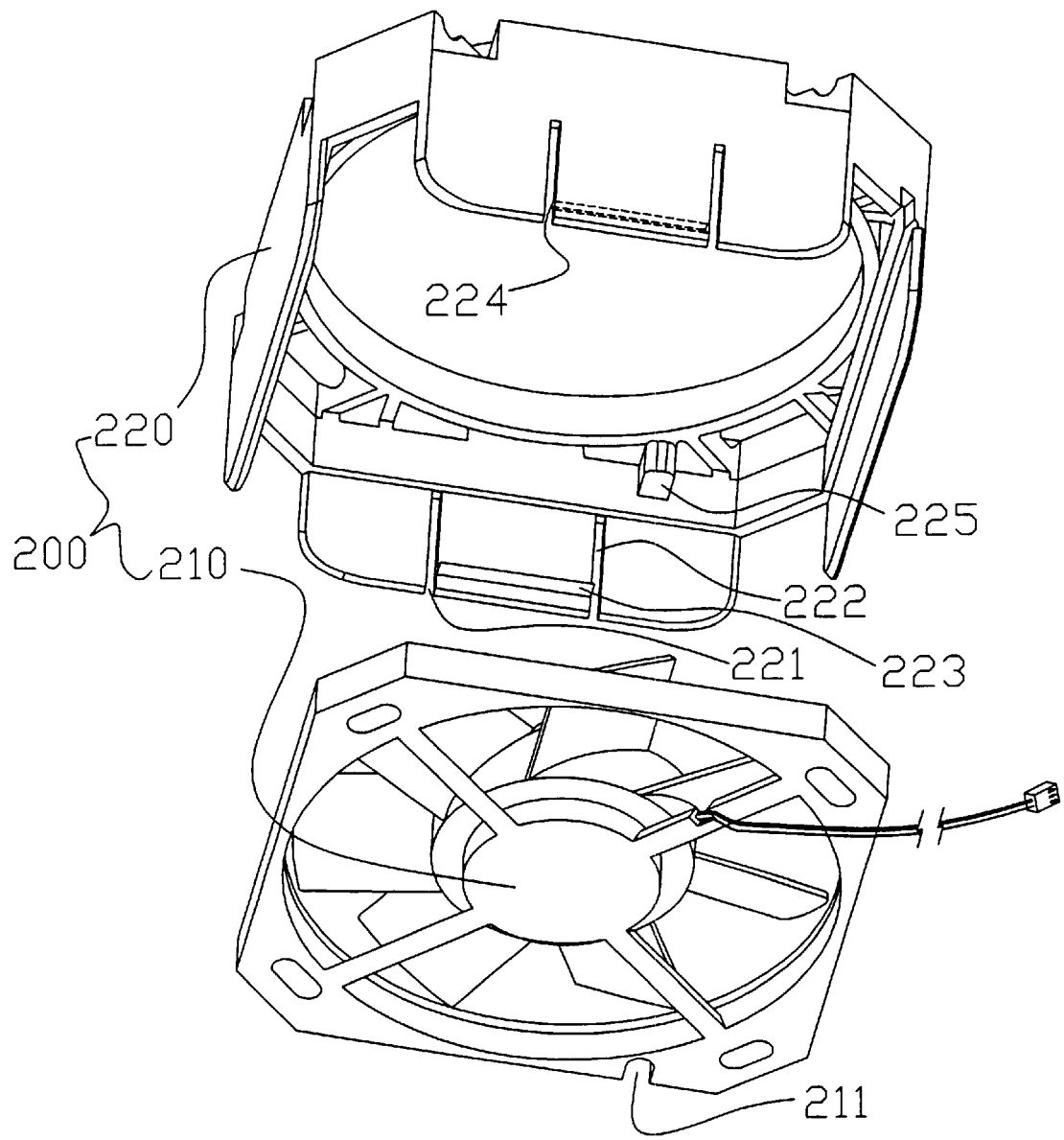
FIG. 5 is a perspective exploded view of a computer CPU heat dissipation module of the present invention.

Referring to FIGS. 3 and 4, there is shown a new computer CPU heat dissipation module comprising a heat dissipation fin 100, a heat dissipation fan 200, and a pair of clipping elements 300. After the CPU 400 is mounted at a CPU seat 500, the top of the CPU 400 is stacked with the heat dissipation fin 100, and the top face of the heat fin 100 is mounted with the heat dissipation fan 200. The clipping elements 300 are used to mount the entire structure, and in particular, the heat dissipation fin 100 is a cubic structure having a height, which is approximately equal to the width and length thereof. A plurality of heat dissipation side fins 101, 102, 103 are extended toward the circumferential edge of the structure. The bottom end of the surrounding is tapered, and the heat dissipation fan 200 (as shown in FIG. 5) comprises a fan body 210 enclosed by a mask housing 220, which is unidirectional protruded. At an appropriate position within the mask housing 220, a positioning block 225 is protrudedly mounted, which is associated with the positioning recess 211 formed on the surrounding of the fan body 210 such that the fan body 210 can only be mounted at one specific side thereof with the mask housing 220, avoiding the reverse mounting of the fan body 210 and avoiding wrong air ventilation direction of the heat dissipation fan 200.

At the two lateral mask boards of the mask housing 220, a pair of straight through slots 221, 222 is provided. The back of the boards between the pair of the straight through slots 221, 222 are at an appropriate height, and a reverse engaging-hook wall 223, 224 are formed integrally, such that the mask housing 220 can be exactly mounted at the exterior of the side wall of the heat dissipation fin 100. The lateral wall of the heat dissipation fin 100, corresponding to the inverse engaging-hook walls 223, 224, is provided with a fastening slot 110, and when the heat dissipation fan 200 is mounted at the top of the heat fin 100, the inverse engaging-hook walls 223, 224 can be engaged with the corresponding fastening slot 110 such that when the fan body 210 is engaged at the top of the heat dissipation fin 100 and the fan 200 is to be removed from the fin 100, a tool with a flat pointed tip is used to trigger the gap between the through slot 221,222 and the fin 100 such that the engaging-hook walls 223, 224 are disengaged from the corresponding fastening slot 110 so as to remove the heat dissipation fan 200. As the fan body 210 and the mask housing are mounted by the method fastening, the mask housing 220 can be removed from the fan body 210, allowing easy replacement of components and maintenance of the computer.

Figure 6:
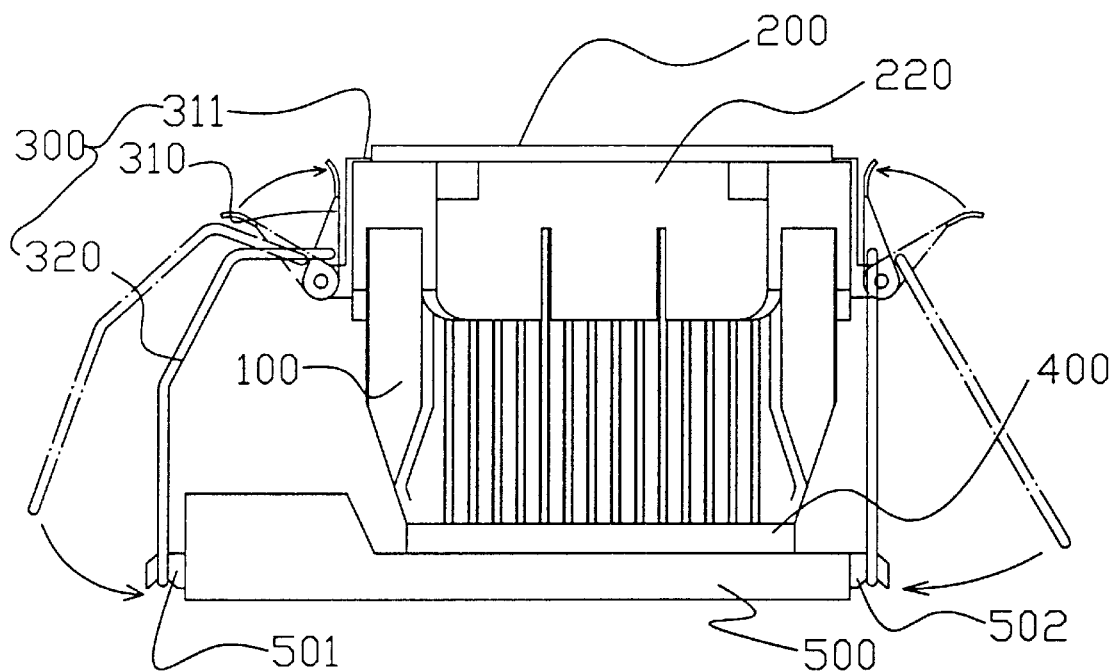
FIG. 6 is schematic view of the fastening action of a computer CPU heat dissipation module of the present invention.
Figure 7:
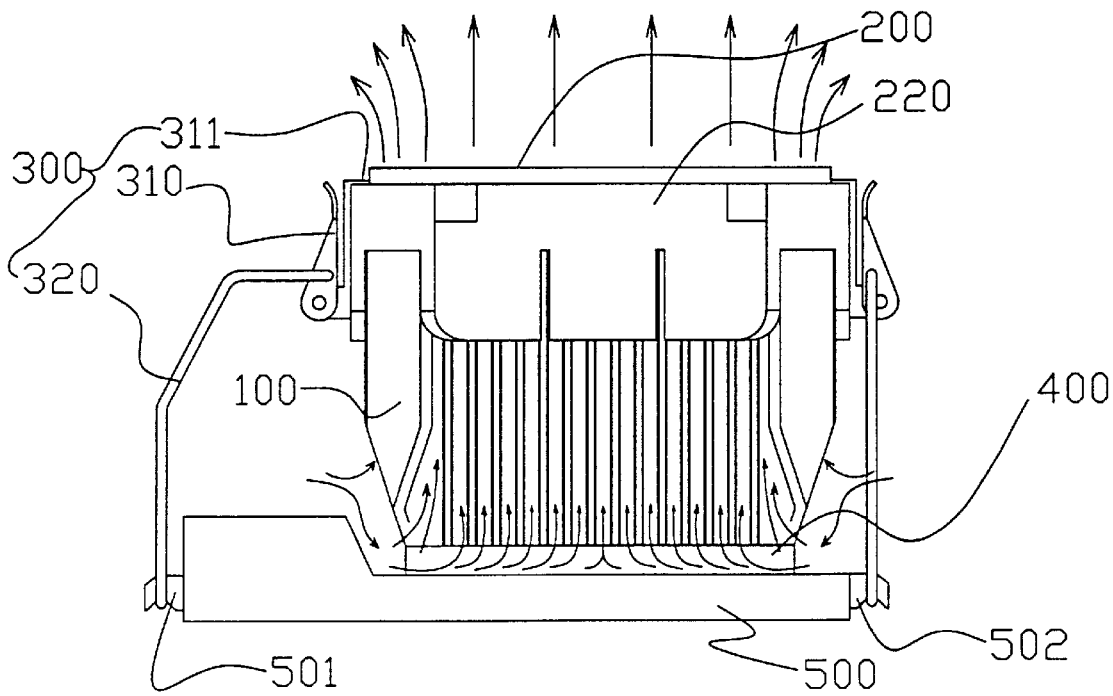
FIG. 7 is an action of heat dissipation of the computer CPU heat dissipation module of the present invention.

The fastening element 300 has one end being a fastening body 310 and the other end being a fastening ring 320, and the fastening ring 320 is a ring body with a bending section in association with the width of the CPU seat 500, and the rear end of the fastening body 310 is provided with a suspension clip 311 so as to mount at the top end of the two lateral sides of the mask housing 220. As shown in FIG. 6, by triggering the fastening body 310, the fastening ring 320 is fastened with the fastening hooks 501, 502, corresponding to the CPU seat 500 for mounting to form a stacked and mounted structure. With respect to heat dissipating effectiveness, as shown in FIG. 7, the heat dissipation fin 100 has extremely large heat dissipation volume and heat dissipation path and his allows greater heat energy absorption by absorbing heat evolved by the CPU 400. The tapered bottom end of the heat dissipation fin 100 formed into an extended slanting side increases the contact surface of the bottom section with the surrounding air, such that the ventilation at the bottom section can assist in transferring the heat energy of the heat dissipation side fin, and thus the heat dissipation effectiveness of the entire heat dissipation fin 100 is excellent. In addition, the mask housing 220 has an external long masking plate, which can guide the heat dissipation air current between the individual heat dissipation side plates at the top of the heat dissipation fin 100, to produce the exact direction of flow, which is indicated by the indication of the arrow.

There is a sufficient distance between the bottom edge of the mask housing 220 to the bottom end of the heat dissipation fin 100 so as to provide a distance between the fan and the CPU 400 and forms convection current turbulence, which lowers the heat energy dissipation.

While the invention has been described with respect to preferred embodiments, it will be clear to those skilled in the art that modifications and improvements may be made to the invention without departing from the spirit and scope of the invention. Therefore, the invention is not to be limited by the specific illustrative embodiment, but only by the scope of the appended claims.

I claim:

1. A structure of computer CPU heat dissipation module comprising a heat dissipation fin, a heat dissipation fan, a pair of fastening elements, the CPU being mounted at a CPU seat and the top of the CPU mounted with the heat dissipation fin, and the top face of the heat dissipation fin being mounted with the heat dissipation fan which is then fastened by the fastening element, characterized in that the heat dissipation fin is a cubic structure having a height approximate the same as the length and width and the heat dissipation side fin is protruded toward the surrounding and the bottom end thereof is tapered, and the heat dissipation fan has a fan body enclosed by a unidirectional mask housing which can exactly cover the wall of the top surrounding of the heat dissipation fin such that the fan body is stacked on the top of the heat dissipation fin, and the fastening element has one end being a fastening body, and the other end is a fastening ring, the back end of the fastening body has a suspension clip so as to fasten the top end at the two lateral wall of the mask housing, thereby the fastening body can cause the fastening ring to fasten a fastening hook corresponding to the CPU seat.

2. A structure of computer CPU heat dissipation module as set forth in claim 1, wherein the surrounding of the interior of the mask housing is provided with a positioning block and the fan body, corresponding to the positioning block, is provided with a recess such that the fan body can mount at a specific face.

3. A structure of computer CPU heat dissipation module as set forth in, claim 1, wherein the two lateral mask board of the mask housing are provided with a pair of through slots, and the back position of the slot, an inverse engaging-hook wall is extended, and the lateral wall of the heat dissipation fin, corresponding to the inverse engaging-hook, a fastening slot is formed, such that when the heat dissipation fan covers the top of the heat dissipation fin, the inverse engaging hook wall is engaged at the fastening slot, and the fan body is stacked on the top of the heat dissipation fin.

* * * * *